United States Patent [19]
Shay

[11] Patent Number: 6,021,501
[45] Date of Patent: Feb. 1, 2000

[54] CLOCK ENABLE/DISABLE CIRCUIT OF POWER MANAGEMENT SYSTEM

[75] Inventor: Michael John Shay, Arlington, Tex.

[73] Assignee: National Semiconductor Corporation, Santa Clara, Calif.

[21] Appl. No.: 09/009,848

[22] Filed: Jan. 20, 1998

Related U.S. Application Data

[62] Division of application No. 08/451,206, May 26, 1995, Pat. No. 5,805,923.

[51] Int. Cl.⁷ .................................. G06F 1/32; G06F 1/10
[52] U.S. Cl. .............................. 713/322; 713/60; 331/18; 327/291
[58] Field of Search .................................... 713/322, 320, 713/300, 500, 502, 600, 601, 501; 331/18, 46; 326/93; 327/166, 291, 286

[56] References Cited

U.S. PATENT DOCUMENTS

| | | | |
|---|---|---|---|
| 4,479,096 | 10/1984 | Fowks | 331/3 |
| 5,056,144 | 10/1991 | Cornelius | 331/49 |
| 5,153,535 | 10/1992 | Fairbanks et al. | 331/143 |
| 5,189,319 | 2/1993 | Fung et al. | 307/452 |
| 5,204,953 | 4/1993 | Dixit | 395/400 |
| 5,254,888 | 10/1993 | Lee et al. | 307/480 |
| 5,259,006 | 11/1993 | Price et al. | 375/107 |
| 5,307,003 | 4/1994 | Fairbanks et al. | 323/222 |
| 5,331,669 | 7/1994 | Wang et al. | 375/118 |
| 5,404,473 | 4/1995 | Papworth et al. | 395/375 |
| 5,408,626 | 4/1995 | Dixit | 395/400 |
| 5,428,790 | 6/1995 | Harper et al. | 395/750 |
| 5,442,642 | 8/1995 | Ingalls et al. | 371/22.5 |
| 5,606,704 | 2/1997 | Pierce et al. | 395/750 |
| 5,719,516 | 2/1998 | Sharpe-Geisler | 327/291 |
| 5,883,529 | 3/1999 | Kumata et al. | 326/93 |
| 5,886,582 | 3/1999 | Stansell | 331/1 A |

OTHER PUBLICATIONS

Serra, Micaela & Dervisoglu, Bulent I., "Testing", Chapter 79, The Electrical Engineering Handbook, Richard C. Dorf, Editor–in–Chief, pp. 1808–1837, CRC Press.

L–T Wang et al., "Feedback Shift Registers for Self–Testing Circuits", VLSI Systems Design, Dec. 1986.

Masakazu Shoji, "CMOS Dynamic Gates", Chapter 5, AT&T CMOS Digital Circuit Technology, Prentice Hall, 1988, pp. 210–257.

Guthrie, Charles, "Power–On Sequencing For Liquid Crystal Displays; Why, When, And How", Sharp Application Notes, Sharp Corporation, 1994, pp. 2–1 thru 2–9.

(List continued on next page.)

*Primary Examiner*—Gopal C. Ray
*Attorney, Agent, or Firm*—Limbach & Limbach L.L.P.

[57] ABSTRACT

A power management system is disclosed. The system includes an oscillator interface for use in a power management system, a power recycle circuit for use in a power management system, a pad clock and self test for use in a power management system, a clock enable circuit for use in a power management system, a power level detect circuit for use in a power management system, an internal source clock generation circuit for use in a power management system, and a power-save mode change detection circuit for use in a power management system. The oscillator interface includes an interle circuit for interfacing with an external oscillator used as a source of oscillations. A clock stabilization filter masks out spurious crystal frequencies in the oscillations during start-up of the power management system following an enabling of a feedback loop. The clock stabilization filter has circuitry which provides that the oscillations will start with a rising transition after filtering. A bypassing circuit enables the clock stabilization filter when the external oscillator is a crystal oscillator and for bypassing the clock stabilization filter when the external oscillator is a can oscillator. A masking circuit masks the oscillations from the rest of the power management system. The masking circuit has circuitry which disables the clock masking after a falling edge of the oscillations and stats back up with a rising transition of the oscillations.

21 Claims, 14 Drawing Sheets

OTHER PUBLICATIONS

Bernd Moeschen, "NS32SP160—Feature Communication Controller Architecture Specification", National Semiconductor, Rev. 1.0, May 13, 1993.

Agarwal, Rakesh K., 80×86 Architecture and Programming, vol. II: Architecture Reference, Chapter 4, Prentice Hall, 1991, pp. 542–543.

Intel486 Microprocessor Family Programmer's Reference Manual, Intel Corporation, 1993.

8237A High Performance Programmable DMA Controller (8237A–4, 8237A–5), Peripheral Components, Intel, 1992, pp. 3–14 thru 3–50.

Kane, Gerry, "R2000 Processor Programming Model", Chapter 2, MIPS RISC Architecture, MIPS Computer Systems, Inc.

Hennessy, John, et al., "Interpreting Memory Addresses", Computer Architecture A Quantitative Approach, pp. 95–97, Morgan Kaufmann Publishers, Inc. 1990.

Power PC601 Reference Manual, IBM, 1994, Chapter 9, "System Interface Operation", pp. 9–15 thru 9–17.

Intel Corp. Microsoft Corp., Advanced Power Management (APM) BIOS Interface Specification, Revision 1.1, Sep. 1993.

Intel Corporation, i486 Micro Processor Hardware Reference Manual, Processor Bus, pp. 3–28 thru 3–32.

PWRGOOD QUALIFICATION

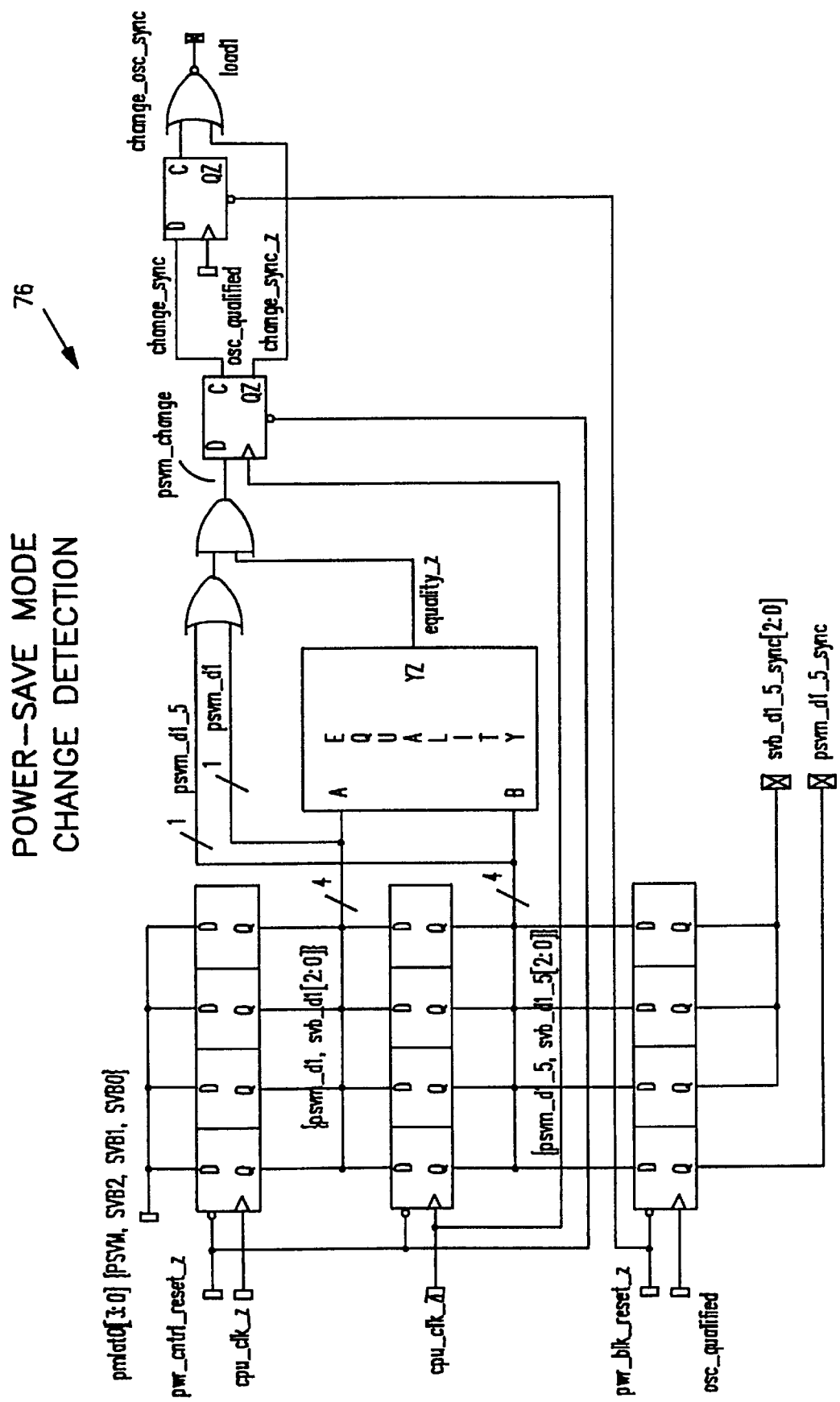

CLOCK ENABLE/DISABLE CIRCUIT OF POWER MANAGEMENT SYSTEM

This is a divisional of application No. Ser. 08/451,206 filed May 26, 1995 (now U.S. Pat. No. 5,805,923).

BACKGROUND OF THE INVENTION

1. Field of the Invention

The present invention relates to power management systems, and more particularly, to a configurable power management system.

2. Description of the Related Art

Previous power management systems for use with integrated circuit (IC) chips have been limited in their ability to be configured. Thus, there is a need for a power management system which is configurable.

SUMMARY OF THE INVENTION

The present invention provides an oscillator interface for use in a power management system. An interface circuit interfaces with an external oscillator used as a source of oscillations. A clock stabilization filter masks out spurious crystal frequencies in the oscillations during start-up of the power management system following an enabling of a feedback loop. The clock stabilization filter has circuitry which provides that the oscillations will start with a rising transition after filtering. A bypassing circuit enables the clock stabilization filter when the external oscillator is a crystal oscillator and bypasses the clock stabilization filter when the external oscillator is a can oscillator. A masking circuit masks the oscillations from the rest of the power management system. The masking circuit has circuitry which disables the clock masking after a fang edge of the oscillations and starts back up with a rising transition of the oscillations.

The present invention also provides a power recycle circuit for use in a power management system. An input receives a clock signal. A detection circuit for senses a minimum disable pulse when a clock signal is received and when a clock signal is not received. A power recycle circuit generates a power recycle signal in response to the minimum disable pulse. A state machine holds the power recycle signal for at least two clock cycles.

The present invention also provides a pad clock and self test circuit for use in a power management system. An input receives an oscillator clock. A clock generation circuit generates at a clock output a first pad clock having a frequency approximately equal to one-half a frequency of the oscillator clock, a second pad clock having a frequency that is forced equal to a programmable fraction of the frequency of the oscillator clock, and a low signal. The clock generation circuit has a first operating mode in which the second pad clock is generated and a second mode in which internal signals of the power management system can be observed and the clock output is forced to a known level.

The present invention also provides a clock enable circuit for use in a power management system. A clock branch generator generates a first clock signal to drive a sequential device which is internal to the power management system. A clock enabling/disabling circuit disables the first clock after a falling edge on an internal source clock, holds the first clock low during disabling, re-enables the first clock after a falling edge of the internal source clock, and subsequently begins a first rise of the first clock with a next rising transition of the internal source clock. The clock enabling/disabling circuitry does not stop an external CPU core clock when the external CPU is actively performing a bus cycle.

The present invention also provides a power level detect circuit for use in a power management system. An analog voltage-level detector interface has a programmable override function for providing a digitally encoded voltage level as an output which is used for global configuration. An input receives an analog enable signal to turn on a Dc-current source of an external voltage-level detector and a read strobe. A voltage-level detector input is sampled.

The present invention also provides an internal source clock generation circuit for use in a power management system. A synchronous counter with a synchronous load to a count of one and an asynchronous clear has a plurality of count output signals. A first multiplexer having two outputs is coupled to the synchronous counter and receives the plurality of count output signals. A second multiplexer having one output is coupled to the first multiplexer. A flip-flop is coupled to the output of the second multiplexer, and a clock referenced to an external oscillator clock samples an output of the flip-flop.

The present invention also provides a power-save mode change detection circuit for use in a power management system including an internal source clock, a first bank of flip-flops coupled to the internal source clock, and a second bank of flip-flops coupled to the internal source clock. A comparator compares the first and second banks of flip-flops and generates an equality signal when there is a difference between storage values of the first and second banks of flip-flops. A change indicator is asserted when a power-save mode is asserted in one of the first and second banks of flip-flops. The change indicator is sampled with a clock which is referenced to a falling edge of a system clock, and a synchronous load 1 pulse is generated until a next rising edge of an internally qualified reference an external oscillator clock.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIG. 11 is a schematic diagram illustrating the power-save mode change detection block shown in FIG. 1.

DETAILED DESCRIPTION OF THE PREFERRED EMBODIMENT

Figure 1A:
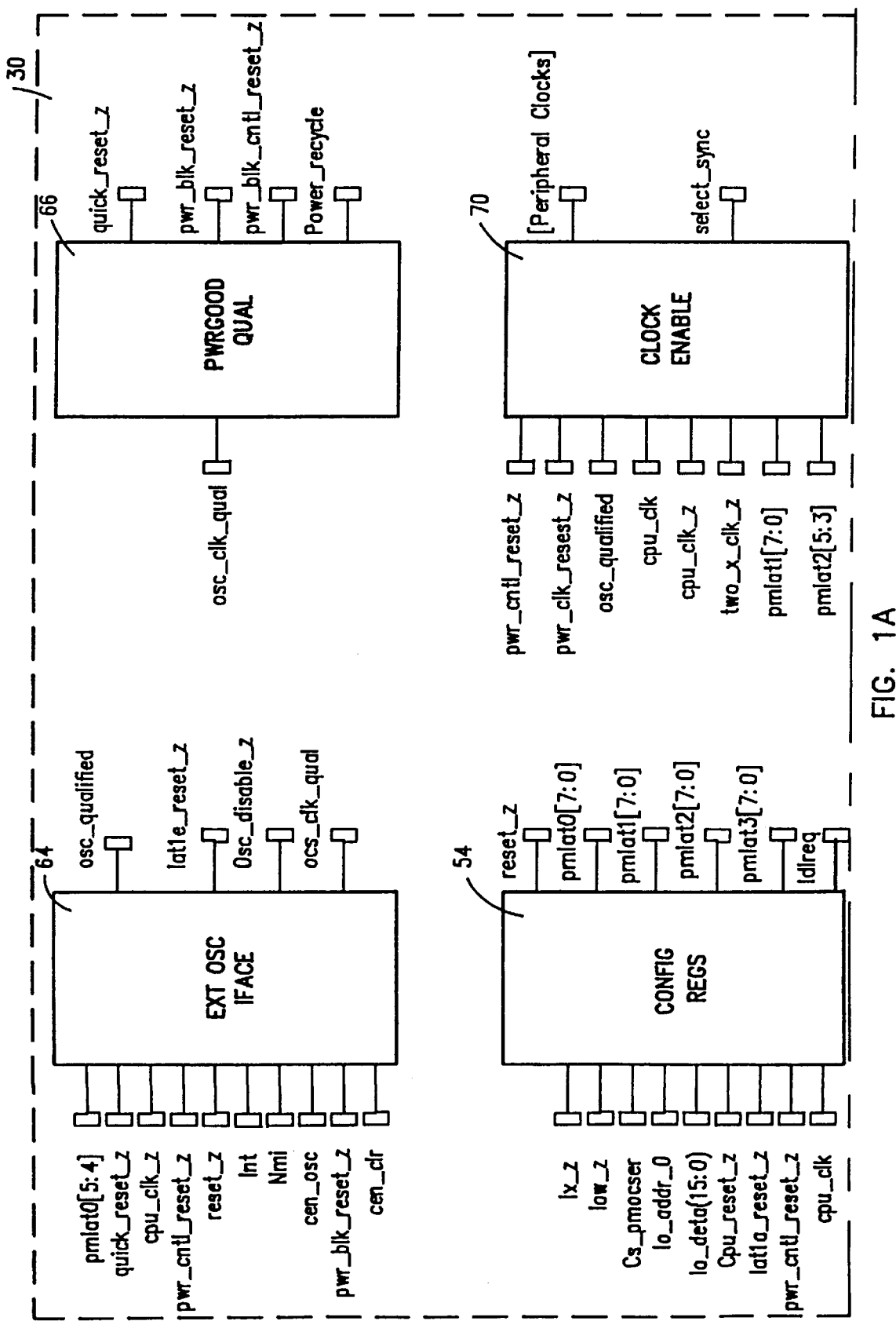
FIG. 1 consisting of FIGS. 1A and 1B is a block diagram illustrating a power management system in accordance with the present invention.
Figure 1B:
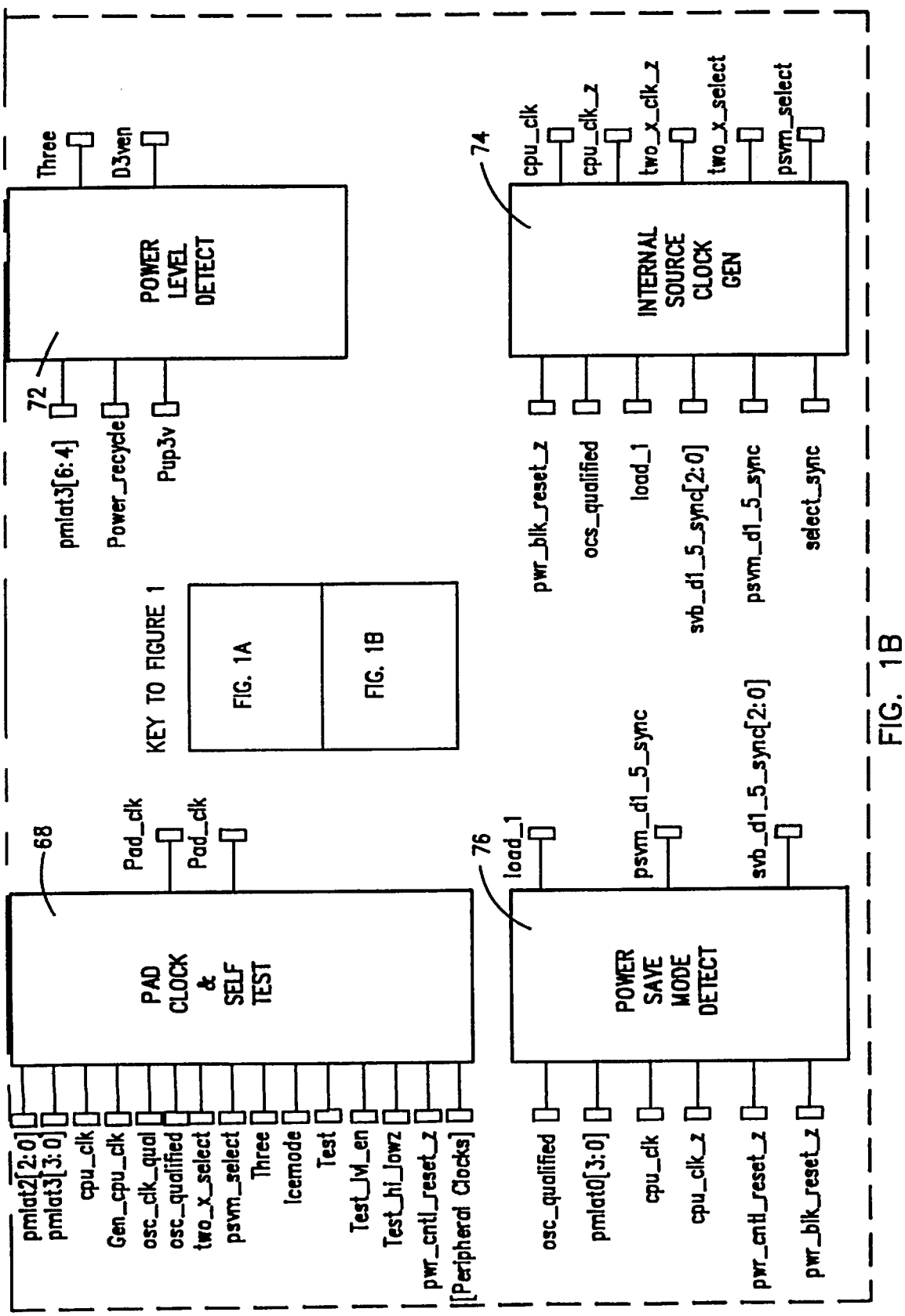
Figure 2:
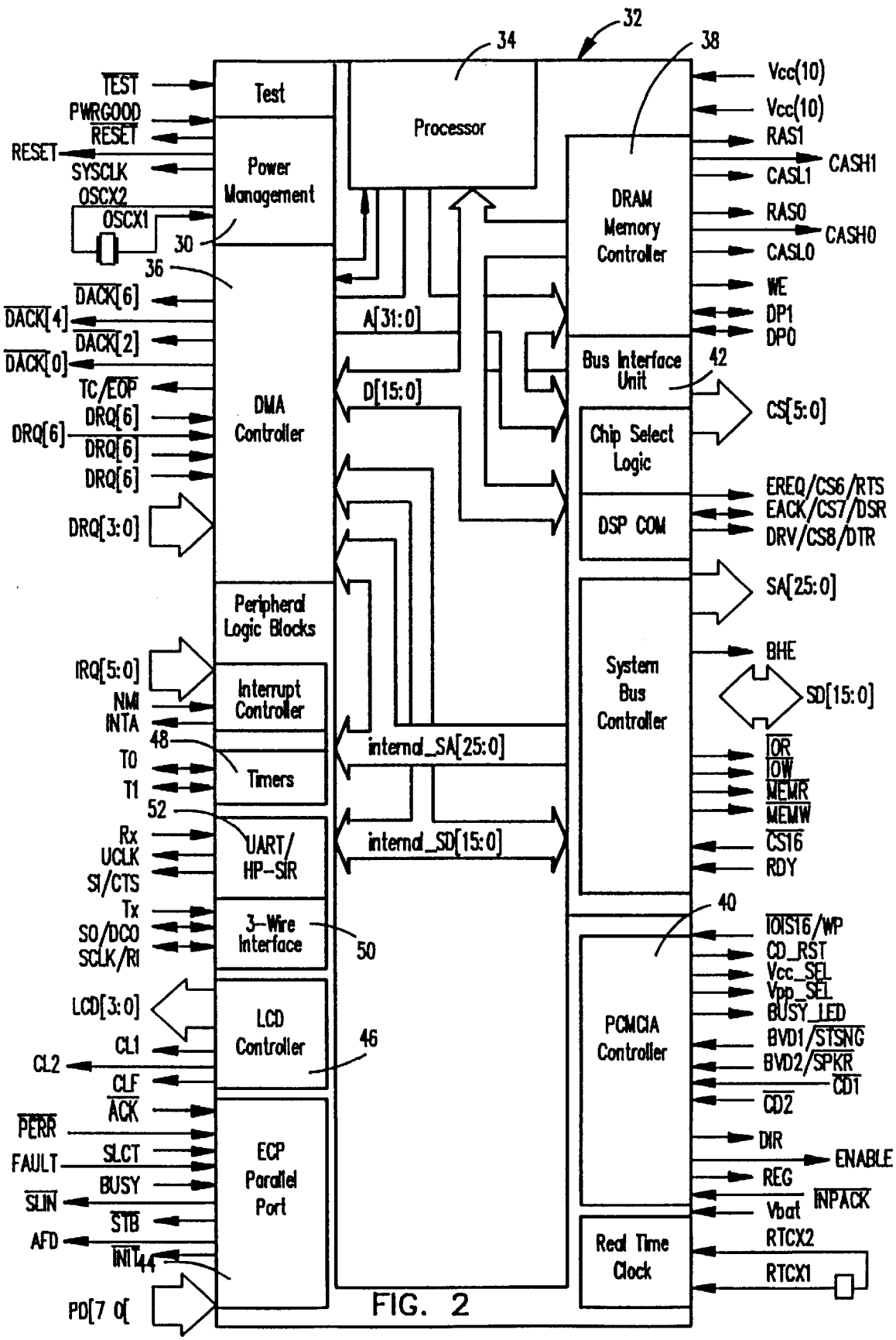
FIG. 2 is a block diagram illustrating a system which incorporates the power management system shown in FIG. 1.

Referring to FIG. 1, there is illustrated a power management system 30 in accordance with the present invention. Referring to FIG. 2, the power management system 30 is ideal for being implemented in the system 32. The system 32 is described in the data sheet entitled "Elentari Optimized 32-bit 486-class Controller With On-chip Peripherals for Embedded Systems", authored by National Semiconductor Corporation of Santa Clara, Calif., a copy of which is attached hereto and is incorporated herein by reference. The system 32 includes a CPU 34, a DMA controller 36, a DRAM memory controller 38, a PCMCIA controller 40, a bus interfa unit (BIU) 42, an ECP parallel port 44, an LCD controller 46, as well as other components. Although the power management system 30 is ideal for incorporation into the system 32, it should be well understood that such incorporation is not a requirement of the present invention and that the teachings of the present invention may be applied to smaller (or larger) stand-alone applications. Also attached hereto is a copy of a document entitled "Elentari Core Internal Bus Spec" which is also incorporated herein by reference. Finally, attached hereto is a copy of a document entitled "Internal Peripheral Bus Signals" which is also incorporated herein by reference.

The power management system 30 includes a number of power saving mechanisms that can be combined to achieve comprehensive power savings under a variety of system conditions. First of all the core processor 34 power consumption can be controlled by varying the processor/system clock frequency. The internal CPU clock can be divided by 4, 8, 16, 32 or 64. In addition, in idle mode, the internal processor clock will be disabled. Finally, if an crystal oscillator circuit or external oscillator is being used, it can be disabled. For maximum power savings, all internal clocks can be disabled (even the real-time clock oscillator).

Some peripherals, notably the timer 48 and the PCMCIA interface 40 can be switched between a fixed frequency (external oscillator/2) and the CPU clock. When the CPU clock is being divided, this can reduce their power consumption. Note that the clocks for other on-board peripherals can be individually or globally controlled. By setting bits in the power management control registers (discussed below), the internal clocks to the DMA controller 36, the ECP port 44, the threewire interface 50, the timer 48, the LCD controller 46, the DRAM controller 38, the PCMCIA controller 40 and the UART 52 can be disabled. In addition, the power management system 30 can programmed the of use CMOS level I/Os or TTL level I/O settings in the system 32. Finally, the external SYSCLK can be disabled via a bit in the Power Management Control Register.

The power management system 30 includes several modes of operation which are listed here in decreasing power consumption order (i.e., full power to least power). In the Normal Mode all clocks are at full speed, with the Timer, PCMCIA, SYSCLK connected to cpu_dock or external OSC/2, and the UART, DRAM refresh logic, and LCD Controller connected to OSC dock, and the RTC connected to RTC_osc. In the Power Save Mode, first, the CPU clock is divided by 4, 8, 16, 32 or 64, with the Timer, PCMCIA, SYSCLK connected to external OSC/2, the UART, DRAM logic, and LCD Controller connected to OSC, and the RTC connected to RTC_osc. Second, the CPU clock is divided by 4, 8, 16, 32 or 64 with the Timer, PCMCIA, SYSCLK connected to cpu_clk, UART, DRAM logic, LCD Controller connected to OSC, and RTC connected to RTC_osc. In the Peripheral Power Down Mode the individual Peripherals can be disabled. In the Idle Mode the CPU clock is disabled with all peripherals unaffected, and RTC connected to RTC_osc. In the Crystal Oscillator Circuit Disable/Power Down Mode, first, if a crystal oscillator circuit is being used to drive the system 32, this mode will disable the oscillator circuit (NOTE: after being turned back on, it will take approximately 1 msec for the external crystal to stabilize). Second, if an external oscillator is being used, Power Down mode will disable all the system 32 clocks except for the RTC_osc. (NOTE: This is much faster upon recovery, as there is no stabilization delay). It should be noted that the RTC oscillator is always enabled even during power down mode; it can be disabled if desired.

The following indicates what peripherals are connected to which clocks and how those clock can be disabled/enabled. The CPU 34: 1) Uses cpu_clk (Full speed clock=OSC_CLK/2); 2) cpu_clk can be divided by 4, 8, 16, 32 or 64; 3) In Idle mode, the clock is disabled. The Timer 48, PCMCIA 40, SYSCLK: 1) uses cpu_clk (full speed or divided by 4 8, 16, 32 or 64); 2) or can use external OSC_CLK/2 (when cpu_clk is divided); 3) can be individually disabled. The UART 52, DRAM refresh logic, LCD Controller 46: 1) Connected to OSC; 2) can be individually disabled The ECP 44 and the Thxeewire Serial Interface 50: 1) Connected to OSC_CLK/2; 2) can be individually disabled. The DMA Controller 36 and Bus Interface Unit 42: 1) Uses cpu_clk (full speed or divided). The DRAM Controller 38: 1) Must use OSC_CLK for DRAM refresh cycles; 2) Sequencer can selectably use cpu_clk or 2*cpu_clk; 3) For state machine logic, must use cpu_clk The Real-Time Clock: 1) Uses RTC_ose—typically always enabled, but it can be disabled through the RTC interface. The Global Peripheral Clock Disable/Enable: 1) Controls DMA Controller, ECP, Threvwire Interface, and UART.

The power management system 30 includes several power management modes. Power saving features include the following. In Idle Mode the internal clock to the CPU 34 will be dihled All enabled peripheral blocks will continue to operate. Any interrupt or reset will re-enable the internal clock to the CPU 34. It should be noted that when the CPU 34 is in Idle Mode, the insruction cache cannot snoop. Normally, the cache will snoop the addresses to see if a cache address is being updated If so, it flushes the cache. Therefore, the user's can take the appropriate action when the CPU 34 is idled. Also, when the CPU 34 is in Idle Mode, the BIU 42 is designed to mimic the CPU 34 during DMA interchanges between memory and peripherals. By responding to DRQs and generating DACKs, HOLDs and HOLDAs signals as required, the BIU 42 eliminates the need to reactivate the CPU 34 during such transfers as screen updates from memory to the LCD controller 46. This gives the designer added flexibility in conserving power while maintaining basic system functions.

A Power-save Mode reduces the internal CPU 34/system clock's frequency by dividing the internal CPU clock by 4, 8, 16, 32 or 64 (Refer to Power Management Register 1 for more information) The internal clocks for the UART 52, DRAM refresh logic, LCD Controller 46 and RTC will be unaffected in this mode. The Timer, PCMCIA and SYSCLK all have selectable clock sources between a fixed frequency, which is the external oscillator/2 and cpu_clk. Only when a cpu_clk source is selected will these clocks be affected by Power-save mode.

The Crystal Oscillator Circuit Disable function disables the feedback output of the crystal oscillator circuit (i.e. forces OSCX2 low). Normally, the feedback output is used to provide a high-gain feedback to an external crystal to start, stabilize, and maintain a reference oscillation from the crystal. If the feedback is disabled the oscillation will stop. After the feedback output is re-enabled, it takes approximately 1 msec for the external crystal to start and stabilize. On-chip, there is a lowpass filter and counter to insure that none of the start-up and stabilize oscillations are allowed to pass into the rest of the chip. If an external TTL or CMOS oscillator is used then the feedback output can be disabled to save power. Also, the low-pass filter and counter can be bypassed by setting bit 7 of Power Management Configuration Register 4. This latter action may be useful when an external TTL or CMOS oscillator is used.

In the Power Down Mode all of the internal system 32 clocks except the RTC oscillator will be disabled. If a crystal is used to generate the CPU clock, the CPU Oscillator Circuit Disable feature may be used to turn off the clock instead of this mode. If an external oscillator drives CPUX1, then this mode should be used to turn off the system 32 internal clocks. It is important that power be applied to and removed from the LCD display in proper sequence, otherwise damage can result To prevent damage to the LCD panels, the external DC power supplied to the LCD Display ($V_{EE}$) should be disabled before the LCD Controller's clock is disabled.

The power-up sequence is as follows: 1) Configure the LCD control registers; 2) Apply $V_{DD}$ (5 V or 3 V) to the display; 3) Enable the LCD clock from the power management registers—this must be done within 20 msec of applying $V_{DD}$; 4) Enable the LCD controller. 5) Within 20 msec. max after applying the LCD clock, apply $V_{EE}$ (22 V/−26 V) to the display. The power-down sequence is as follows: 1) Remove $V_{EE}$ from the display; 2) Disable the LCD controller, 3) Within 20 msec. of removing $V_{EE}$, disable the LCD clock; 4) Within 20 msec. of removing the LCD clock, remove $V_{DD}$ from the display. The LCD clock should never be disabled when the LCD is enabled.

The internal clocks for various internal peripherals may be individually enabled/disabled via bits of Power Management Registers 2 and 3 (discussed below). A peripheral's internal clock should only be disabled if that internal peripheral is not to be used.

With respect to global enable/disable of peripheral clocks, when bit 7 of Power Management Register 2 is set to a one, the internal clocks to the DMA Controller 36, ECP 44, ThrWire Interface 50, and UART logic 52 will all be disabled. When that bit is a zero, the individual peripheral clock enable/disable bits will determine if the individual peripheral clocks are enabled or not The DRAM 38 and LCD Controllers 46, PCMCIA 40, BIU 42 and Timer 48 are not affected by global clock enabling/disabling.

The system 32 I/Os are power supply-level configurable. The power management system 30 controls voltage sensing and setting for I/O supply-level configuration. The power management system 30 has the capability to set the operating voltage through firmware (Bit 5 of Power Management Register 4).

As mentioned above, the power management system 30 includes several Power Management Configuration Registers. The Configuration Register Unit (CRUT) 54 contains the configuration registers for controlling the operation of the power management system 30. The CRU 54 also contains a peripheral bus interface for reading and writing of the configuration registers.

Figure 3A:
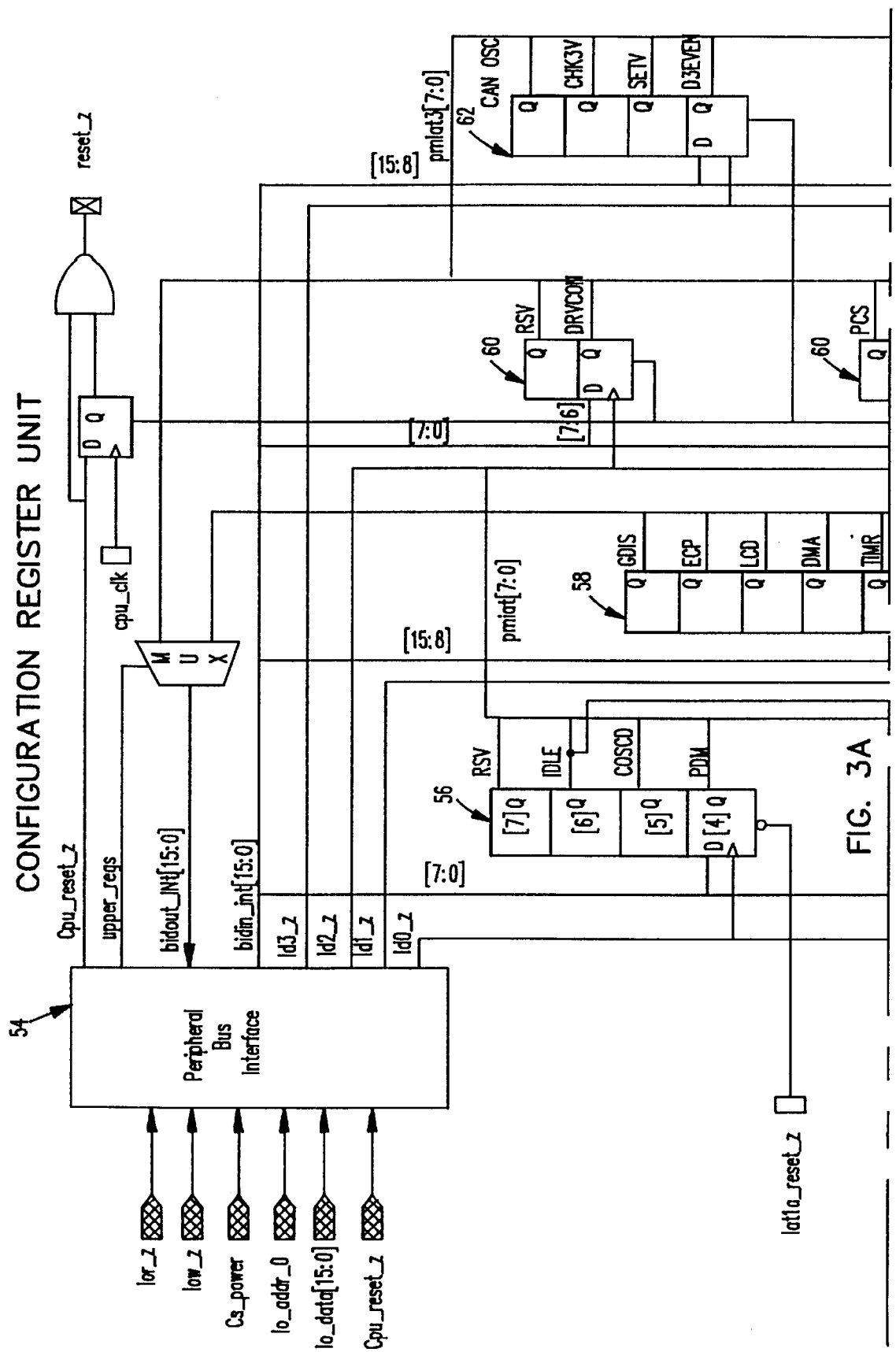
FIG. 3. consisting of FIGS. 3A and 3B is a schematic diagram illustrating the configuration unit shown in FIG. 1.
Figure 3B:
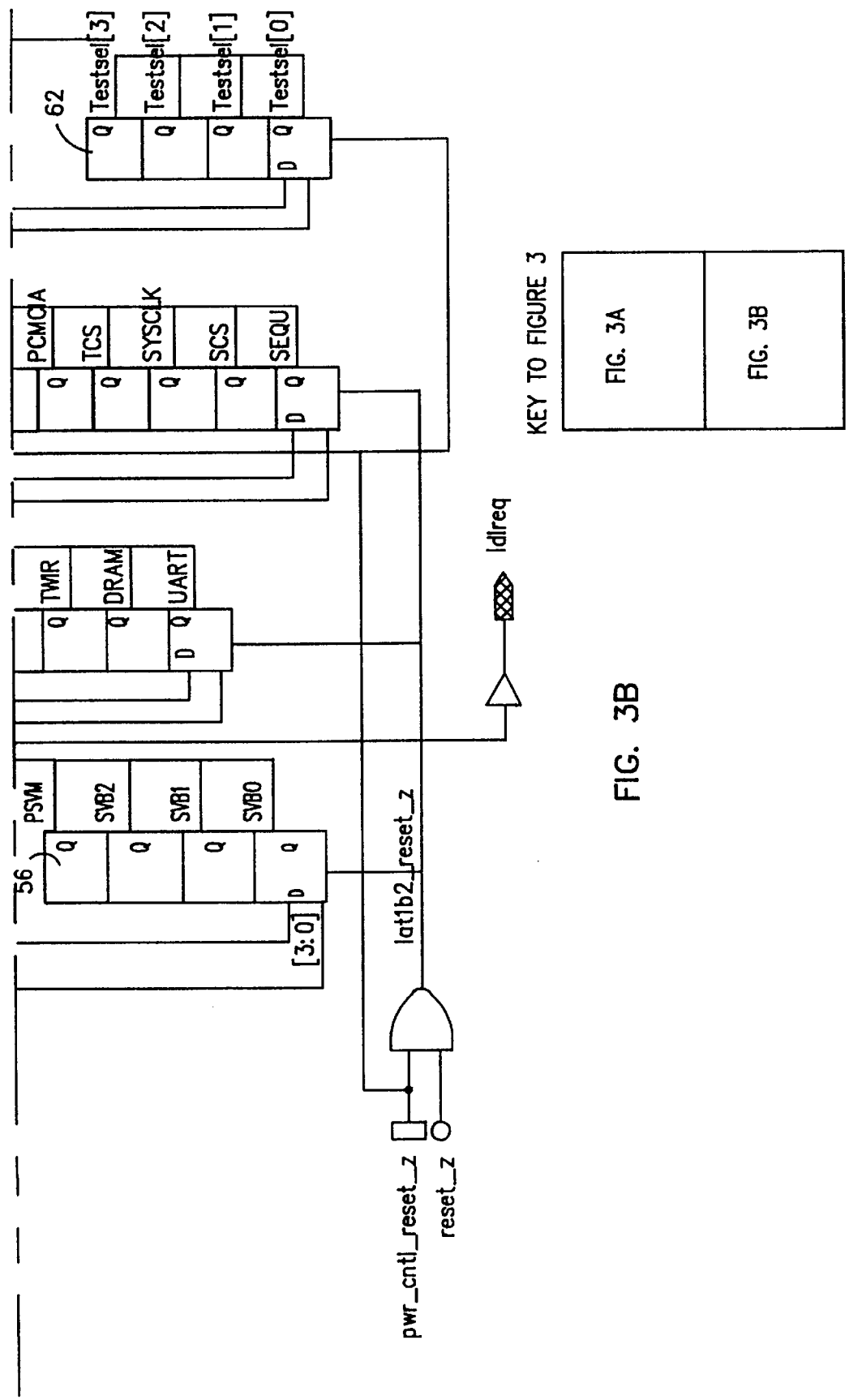

Referring to FIG. 3, Power Management Register One 56 is a read/write register and has an I/O map address of EF90h. The bit assignments are as follows. Bit 7 is reserved Bit 6 is the Idle Mode selection bit IDLE. A "1" sets the chip in Idle Mode (cpu_clk disabled). All resets and interrupts force this bit to a "0". Bit 6 is the oscillator disable bit COSC-CPU (used with crystal oscillator). A "1" disables the CPU oscillator. All resets and interrupts force this bit to a "0". Bit 4 is a Power-down Mode selection bit PDM (used with external OSC). A "1" sets the chip to Power-down Mode. All resets and interrupts force this bit to a "0". Bit 3 is Power-save Mode selection bit PSVM (divides cpu_clk). A "1" sets the chip to the Power-save Mode. All resets force this bit to a "0". Bits 2-0 are Power-save Mode clock division bits SVB[2:0]. All resets force these bits to a "0". Table A illustrates the operation of these bits.

TABLE A

| SVB[2] | SVB[1] | SVB [0] | Divide By |
|---|---|---|---|
| 0 | 0 | 0 | 1 |
| 0 | 0 | 1 | 4 |
| 0 | 1 | 0 | 8 |
| 0 | 1 | 1 | 16 |
| 1 | 0 | 0 | 32 |
| 1 | 0 | 1 | 64 |
| 1 | 1 | X | reserved |

Power Management Register Two 58 is a read/write register and has an I/O map address of EF91h. The bit assignments are as follows. Bit 7 is a Global peripheral clock disabling selection bit GDIS. A "1" causes global peripheral clock disabling. All resets force this bit to a "0". Bit 6 is ECP clock disable selection bit ECP. A "1" disables the ECP clock. All resets force this bit to a "0". Bit 5 is an LCD clock disable selection bit LCD. A "1" disables the LCD clock AlU resets force this bit to a "0". The LCD Controller 46 is not affected by global clock enabling/disabling (GDIS, bit 7). Bit 4 is a DMA clock disabling selection bit DMA. A "1" disables the DMA clock All r force this bit to a "0". Bit 3 is a timer block clock disabling selection bit TIMR. A "1" disables the Tuner Clocks All resets force this bit to a "0". The timer is not affected by global clock enabling/disabling (GDIS, bit 7). Bit 2 is a three-wire block clock disabling selection bit TWIR. A "1" disables the Thrwire Clock. All resets force this bit to a "0". Bit 1 is a DRAM block clock disabling selection bit DRAM. A "1". disables the DRAM Clock. All resets force this bit to a "0". The DRAM controller 38 is not affected by global clock enabling/disabling (GDIS. bit 7). Bit 0 is a UART block clock disabling bit UART. A "1" disables the UART Clock. All resets force this bit to a "0".

Power Management Register Three 60 is a read/write register and has an I/O map address of EF92h. The bit assignments are as follows. Bit 7 is reserved. Bit 6 is an External Driver Configuration bit DRVCON for system bus and DRAM interface I/Os. This bit only has an affect when the interface SETV bit is set to a "1". A "1" guarantees CMOS level output voltages/drive. A "0" guarantees TTL level output voltage/drive (low noise I/O configuration). Bit 5 is a PCMCIA Clock reference Selection bit PCS. A "1" corresponds to Cpu_clk clock reference (affected by Power Save Mode), and a "0" corresponds to standard clock reference (not affected by Power Save Mode). All resets force this bit to a "0". Bit 4 is a PCMCIA block clock disabling selection bit PCMCIA. A "1". disables the PCM-CIA clock. All resets force this bit to a "0". Bit 3 is a Timer Clock reference Selection bit TCS. A "1" corresponds to Cpu_clk clock reference (affected by Power Save Mode), and a "0" corresponds to standard clock reference (not affected by Power Save Mode). All resets force this bit to a "0". Bit 2 is a SYSCLK clock disabling selection bit SYSCLK. A "1". disables the SYSCLK. Only PWRGOOD reset forces this bit to a "0". Bit 1 is a SYSCLK reference Selection bit SCS. A "1" corresponds to Cpu_clk clock reference (affected by Power Save Mode), and a "0" corresponds to standard clock reference (not affected by Power Save Mode). Only PWRGOOD reset forces this bit to a "0". Bit 0 is a DRAM sequencer clock frequency mode bit SEQU. A "1" sets the same frequency as the Cpu_clk clock reference, and a "0" doubles the frequency of the Cpu_clk clock reference. Only PWRGOOD reset forces this bit to a "0".

Figure 4:
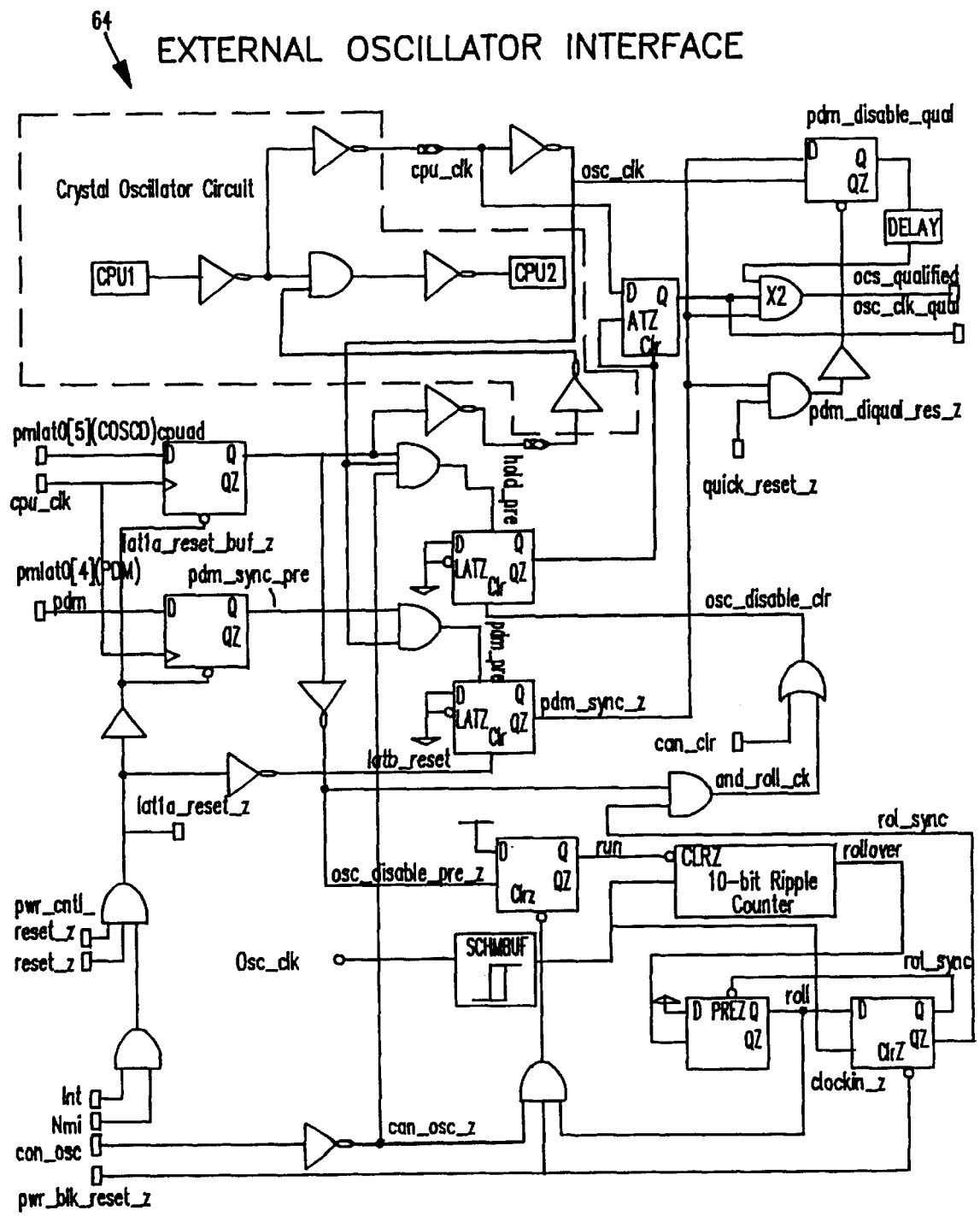
FIG. 4 is a schematic diagram illustrating the external oscillator interface shown in FIG. 1.

Power Management Register Four 62 is a read/write register and has an I/O map address of EF93h. The bit assignments arm as follows. Bit 7 is an external clock source description bit $CAN_{13}$ OSC. A "1" corresponds to a CMOS or TTL oscillator, and a "0" corresponds to a crystal oscillator. Only PWRGOOD reset forces this bit to a "0". Bit 6 is reserved. Bit 5 is a software seting of Operating Voltage bit SETV. A "1" sets 5 V operating voltage, and a "0" sets 3.3 V operating voltage (default). Only PWRGOOD reset forces this bit to a "0". Bits 4-0 are reserve The power management system 30 includes seven other major partitions. Referring to FIG. 4, the External Oscillator Interface (EOI) 64 contains the circuitry that interfaces with an external oscillator. The external oscillator may be a crystal or a can. The circuitry is responsible for controlling the feedback loop of the analog interface to the external crystal. When the feedback look is enabled, the external crystal is forced to oscillate, when disabled the external crystal can not oscillate. If a can oscillator is used the feedback control does not affect the operation of the external oscillator, and thus an oscillation will pass into the external interface circuitry whether or not the feedback look is enabled Feedback disabling may be reset to an enabled state by any one of the following ways: powering-down and back-up, sending out a watchdog reset (the watchdog timer is driven by a separate clock coming from the real-time clock), and a maskable or non-maskable interrupt The feedback loop is enabled by programming a one in the COSCD bit in configuration register one 56 to a "1". Circuitry is used to guarantee that the clock is disabled after a falling edge (Oscillator Disable Mode).

The EOI 64 also contains a clock stabilization filter for masking out spurious crystal frequencies during its start-up following the enabling of the feedback loop. The filter is used when crystals are the source of oscillations; otherwise, when an external can oscillator is used (programmed as the clock source), the filter is bypassed. The bypassing is controlled by programming the $CAN_{13}$ OSC bit in configuration register four 62 to a "1". Circuitry is used to guarantee that clock will come up after filtering, staring with a rising transition, without any logic-generated spurious glitches.

The EOI 64 contains a circuit that masks the incoming clock from the rest of the power management block as well as the rest of the chip (independent of the previously described functionality). The circuit allows an external frequency to come into the part but stay isolated within the EOI 54. The clock masking is enabled by programming a one in the PDM bit in configuration register one 56 to a "1". General clock masking may be reset to an enabled state by any one of the following ways: powering-down and back-up, sending out a watchdog reset (the watchdog timer is driven by a separate clock coming from the real-time clock), and a maskable or non-maskable interrupt. Circuitry is used to guarantee that the clock masking is disabled after a falling edge and starts back up with a rising transition, without any logic-generated spurious glitches (Power Down Mode).

Figure 5B:
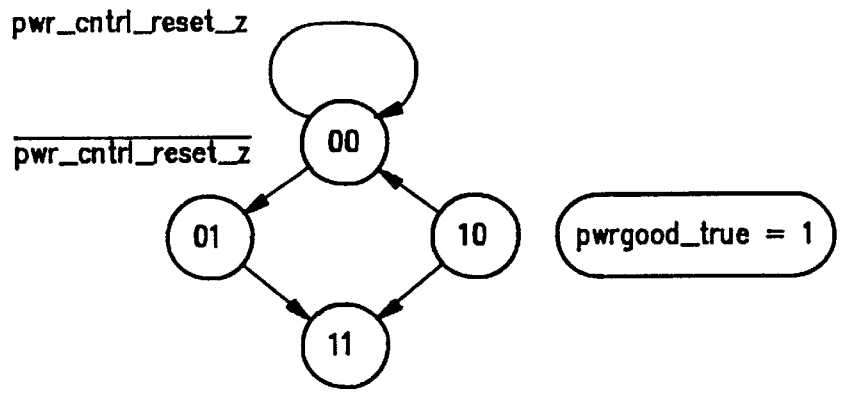
FIG. 5B is a state diagram illustrating the operation of the powergood qualification schematic shown in FIG. 5A.
Figure 5A:
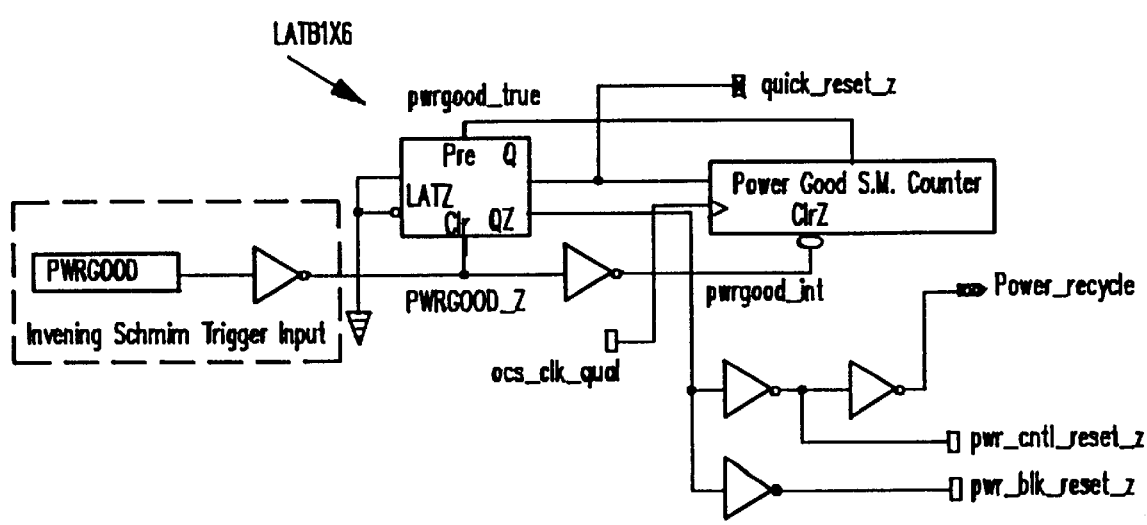
FIG. 5A is a schematic diagram illustrating the power-good qualification block shown in FIG. 1.

Referring to FIGS. 5A and 5B, the Powergood Qualification (PQ) block 66 contains a detection mechanism for sensing a minimum PWRGOOD disable pulse. The detector will detect a PWRGOOD disable pulse independent of whether or not a clock is present. When a PWRGOOD disable occurs, a power recycle signal is immediately generated and held. The PQ block contains a state machine that guarantees that a power recycle indication is held for at least 2 clock cycles. This minimum duration of time is adequate to insure that the power recycle can be processed in other design blocks, such as for example, in asserting a power-up reset. The signal powergoodint is an asynchronous reset that forces the state machine back to state 00 when asserted.

Figure 6:
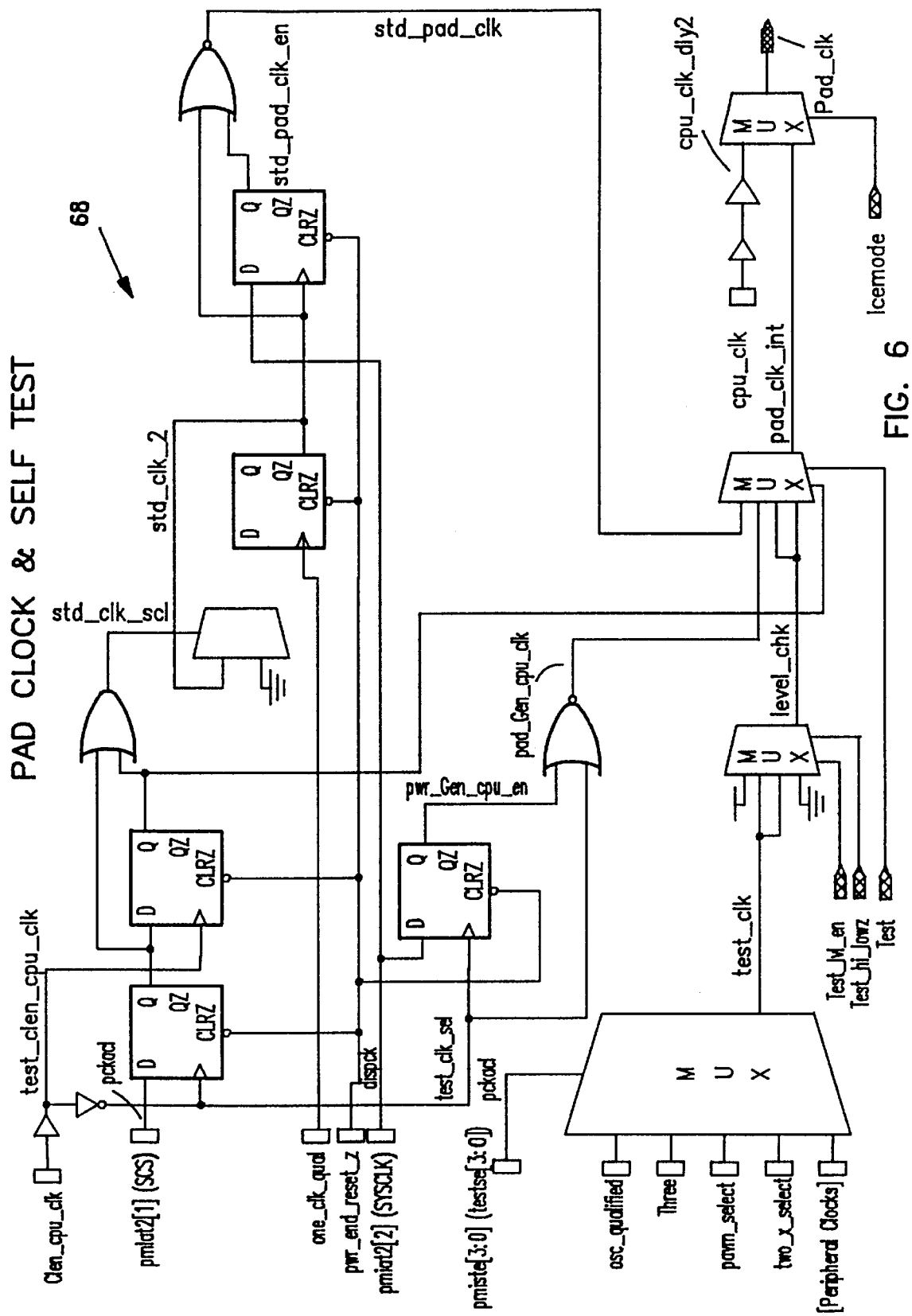
FIG. 6 is a schematic diagarn illustrating the pad clock and self test block shown in FIG. 1.

Referring to FIG. 6, the Pad Clock and Self Test (PCST) block 68 provides control of the Pad_clk which is an output buffer to the external world. In standard operation the PCST block will provide one of the following three configurable conditions. Type 1) a clock whose frequency is constantly one-half that of the external oscillator, Type 2) a clock whose frequency is "generally" one-half that of the external oscillator but is forced equal to a programmable fraction of this frequency when in power-save mode; or, Type 3) disabled low. The Pad_clk may be brought in and out of disabling into the previous modes without glitching similar to methods used in the CEB. The PCST has two non-standard operating modes which are the In-circuit emulator mode and the test mode. During In-circuit emulator mode operation as determined by the Icemode signal being active, the Pad_clk's output is designed to be closely in-phase with the clock generated for the embedded CPU. In test mode as determined by the Test signal being active the PCST is configured to allow observability of internal states of the power management block and force known logic levels on the Pad_clk port. When in test mode and the Test_lvl_en signal deasserted, the clock branches and internal source clocks are selectably muxed out to Pad_clk The selection of which clock is driven out is controlled by programming of the lower nibble of configuration register four 62. When the Test_lvl_en signal is active logic level of Pad_clk is equal to the logic level of Test_hi_lowz.

Figure 7A:
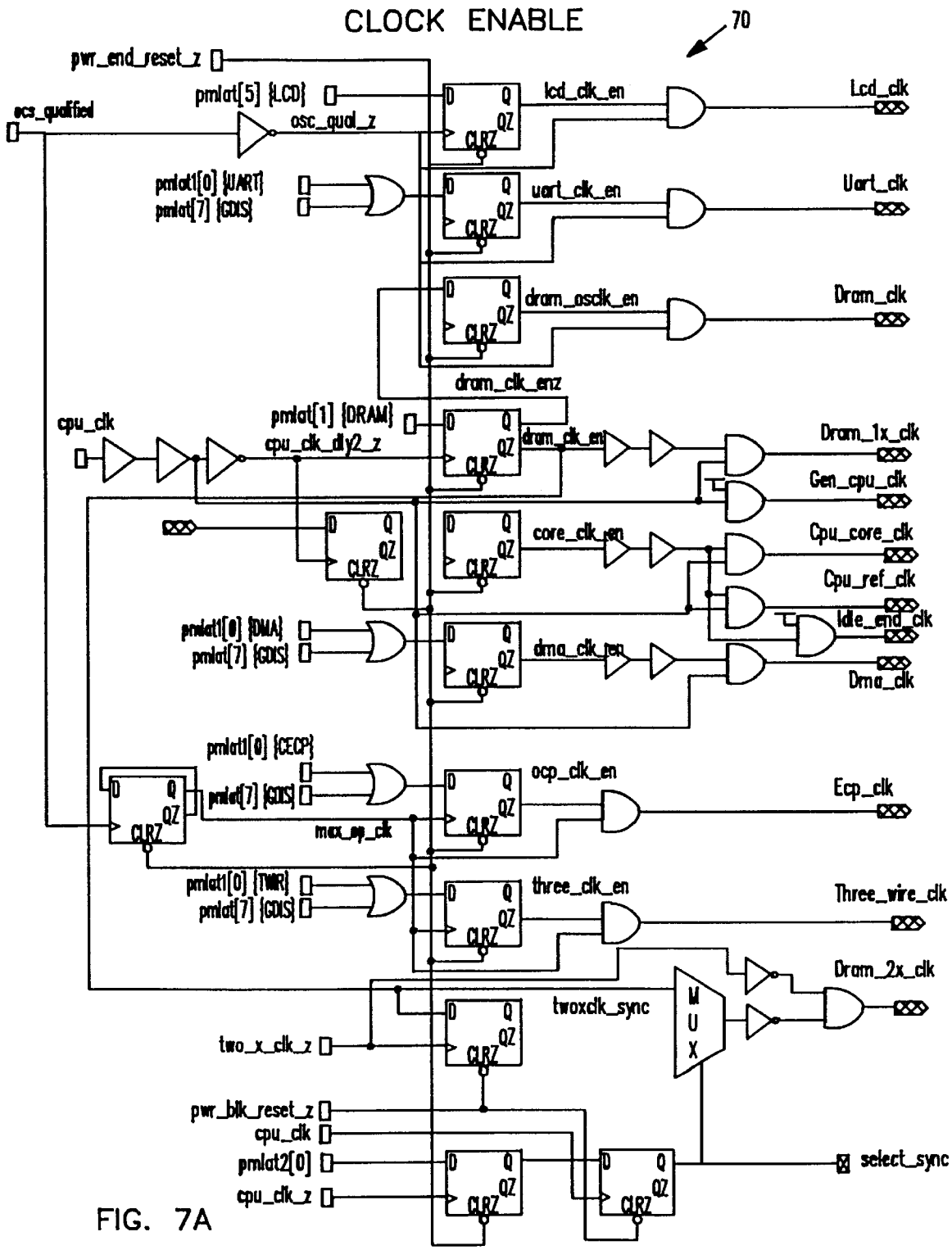
FIGS. 7A and 7B are schematic diagrams illustrating the clock enable block shown in FIG. 1.
Figure 7B:
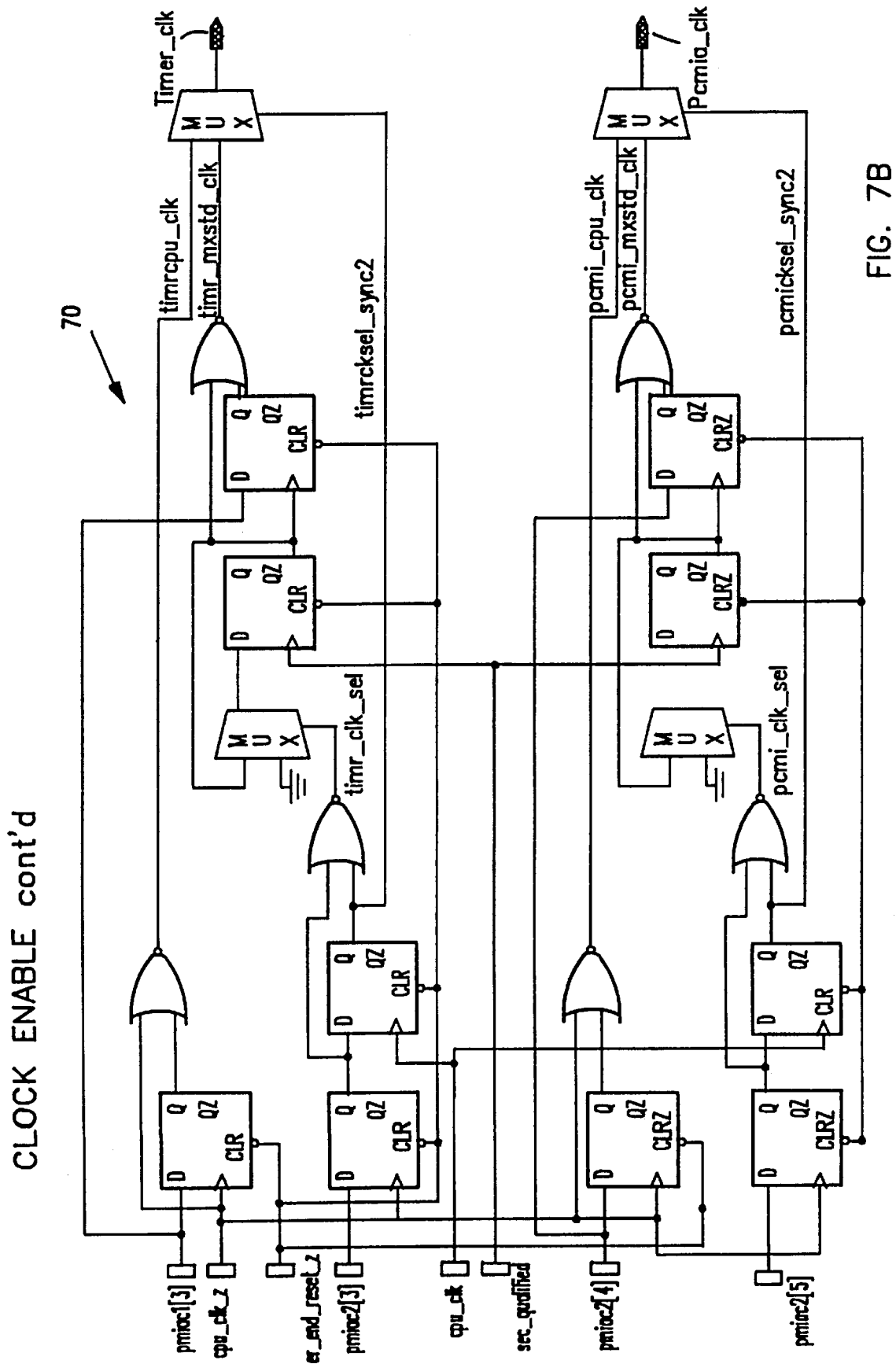

Referring to FIGS. 7A and 7B, the Clock Enable Block (CEB) 70 block contains the clock branch generators for each of the clocks coming out of the power management block driving internal sequential devices. The clock enabling/disabling circuitry is guaranteed to be glitch-free. That is, clocks are disabled after a falling edge on the internal source clocks, are held low during disabling, and are re-enabled after falling edge of the source clock (enabling during the low part of the source clock), and will subsequently begin the first rise with the next rising transition of the internal source clock, without any logic-generated spurious glitches. Special system-level considerations are taken into account for Idle mode assertion. Idle is configurable stoppage of the Clock going to the embedded CPU 34. The main consideration is to not stop the Cpu_core_clk when the embedded CPU 34 is actively performing a bus cycle. The process involved in stopping the embedded CPU 34 is to provide an Idlreq to system control logic and for the system control logic to send back an Idlack which is sampled by the CEB 70 to generate a glitch-free disable. In a similar fashion Idle is disabled by deasserting Idfreq and receiving back a deasserted Idlack by the system control logic. The clock will be restarted glitch-free. (IDLE Mode) The source clocks for the CEB 70 are of type 1, type 2, and a 2x frequency version of type 2. Most of the clocks are generated from one or the other of these source clocks, however, the Timer_clk and Pcmcia_clk may be configured to have either Type 1 or Type 2 clocks. (Global and Individual Peripheral Disable Mode).

Figure 8:
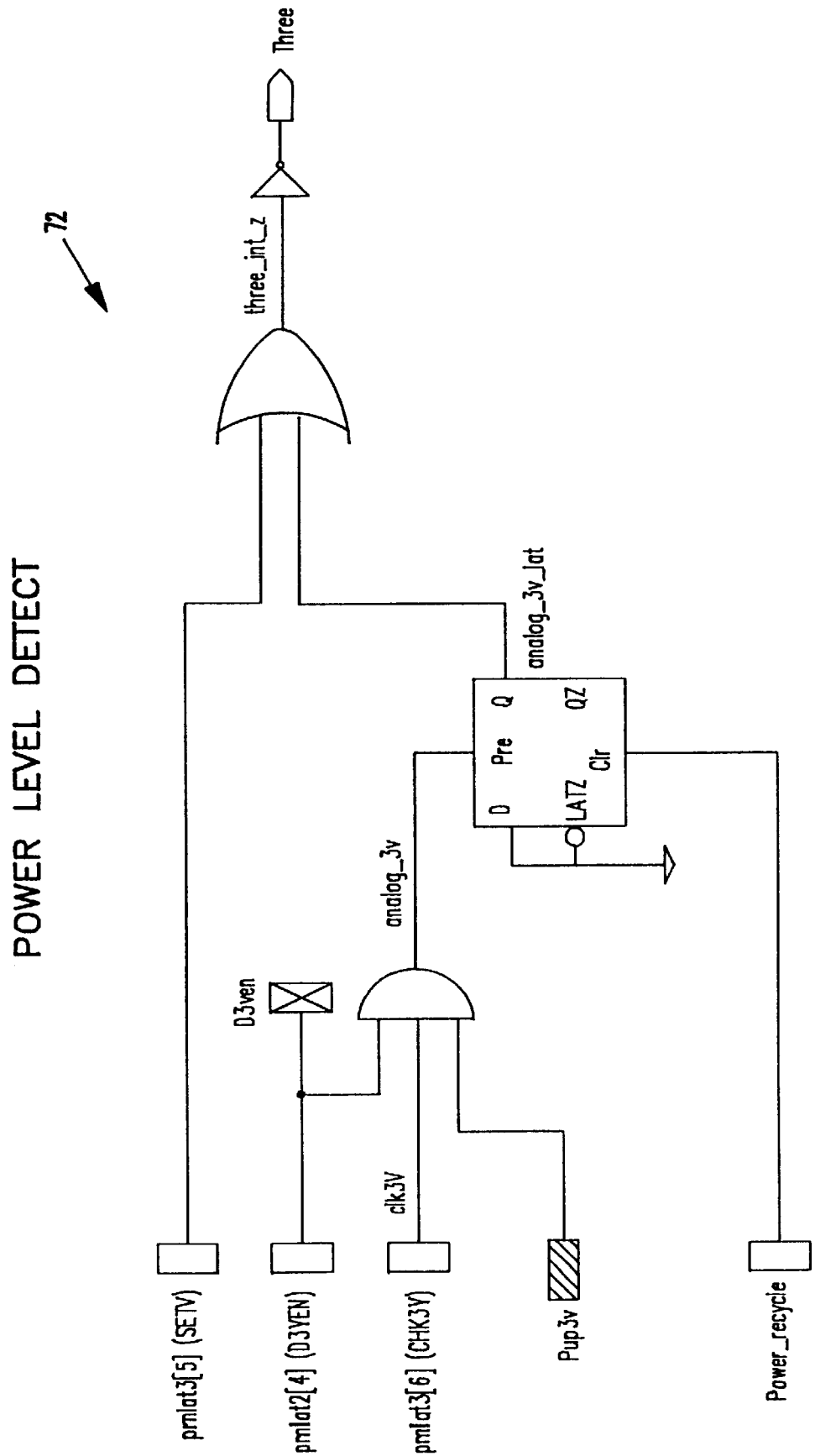
FIGS. 8 and 9 are schematic diagrams illustrating the power level detect block shown in FIG. 1.

Referring to FIG. 8, the Power-Level Detect (PLD) 72 acts as an analog voltage-level detector interface with programmable override. It provides the digitally encoded voltage level as an output which is used for global configuration. An analog enable, D3VEN from configuration register three 60, is available to turn on the DC-current sources of an external voltage-level detector and a read strobe. CHK3V from configuration register three 60, is also available to sample the voltage-level detector input, Pup3V. After the detector input has been sampled, both the CHK3V and D3VEN can be deasserted. It is important to assert D3VEN before CHK3V and deassert in the reverse order so that a correct operational state of Pup3v is captured. The default output of the PLD 72 after a hard reset is one, on port Three. The analog interface functions may be bypassed, and thus, the output signal THREE may be driven under configuration control by the SETV input directly from configuration register three 60.

Figure 9:
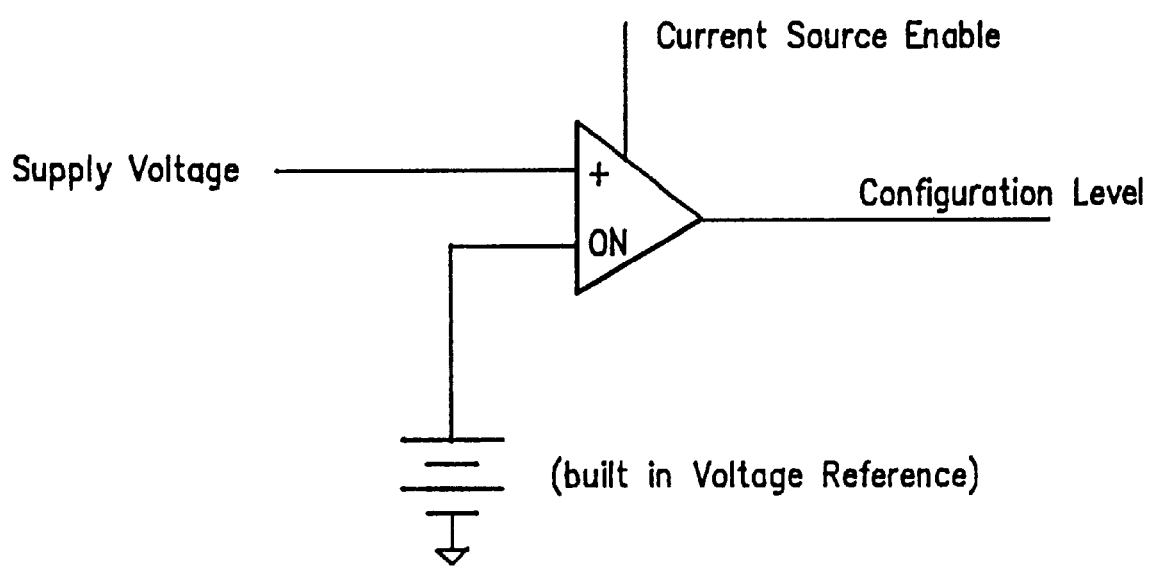

Referring to FIG. 9, many of the system 32 I/Os are power supply-level configurable. As discussed above, the power management system 30 controls the voltage sensing and settg for the I/Os. The power management system 30 described has the capility to set the operating voltage configuration level through firmware and through voltage-level sensing. The interface to an analog voltage sensing circuit is included in the power management block and is controlled by bits 4 and 6 of configuration register four 62. Bit 4 enables the voltage detector. Since analog circuitry generally consumes DC current when active, the enable switch is used to switch the urent on or off. The circuit is, therefore only enabled when voltage detection is needed to reduce power consumption. Bit 6 is used to latch and hold the level of the voltage detector. In this embodiment, the voltage detector needs to detect either a 3.3 V or 5 V supply level. Thus a 1-bit A/D is used and the output configuration level latched is either a Logic 1 or 0. However, higher order A/Ds may be used if finer levels of voltage-level detection are needed. The power configuration level is stored in configuration register four 62 bit 5. The level may be overridden by firmware. This interface voltage detection scheme has been defined to discern voltages above and below a target detection trip point of for example, 4.0 V. Thus, this particular application will have a different configuration level at 5.0 V(+/−10%) then at 3.3(+/−10%).

Figure 10:
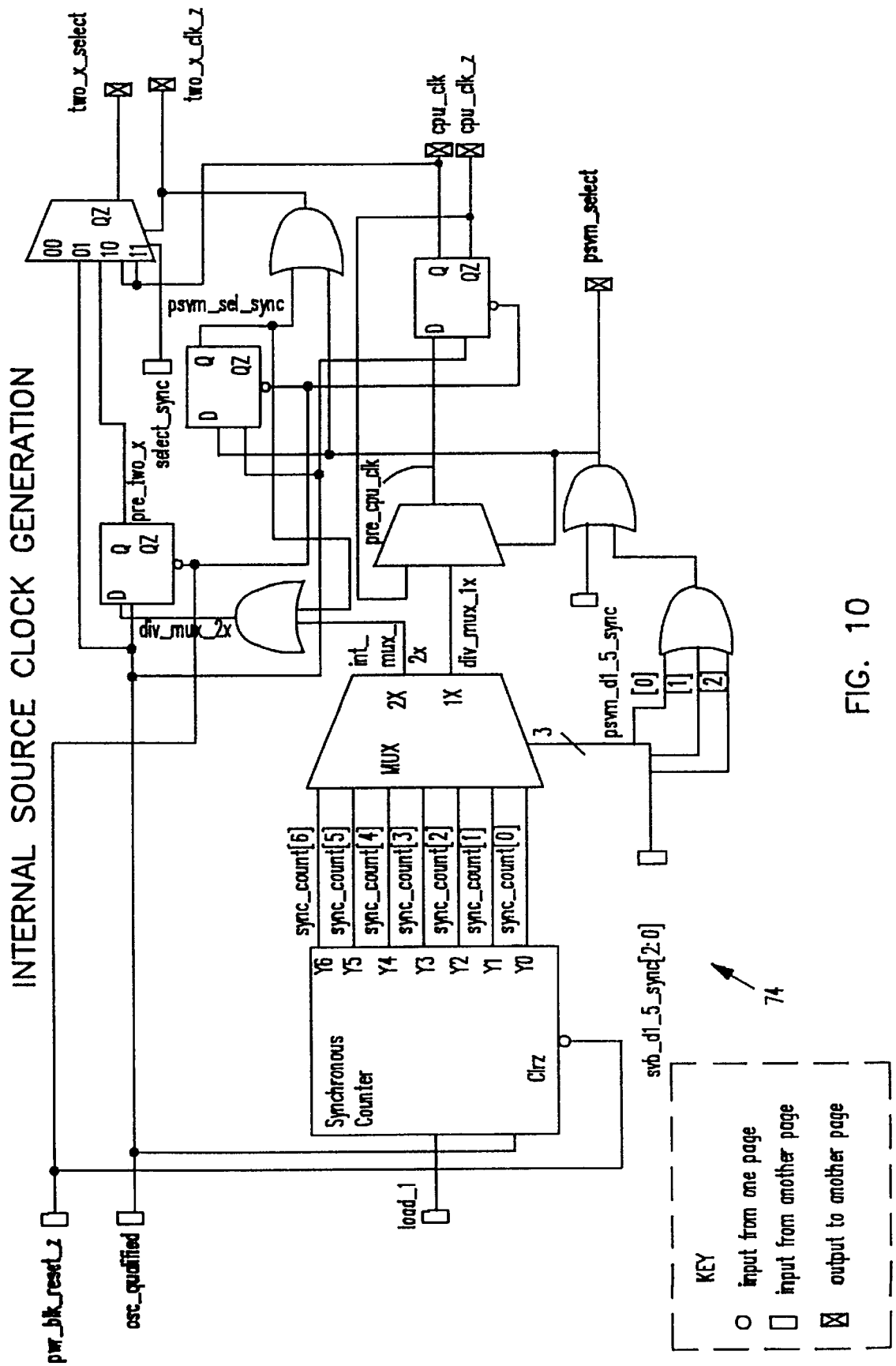
FIG. 10 is a schematic diagram illustrating the internal source clock generation block shown in FIG. 1.

Referring to FIG. 10, the Internal Source Clock Generation (ISCG) block 74 generates the internal source clocks. It contains a 7-bit synchronous counter with a synchronous load to a count of one and an asynchronous clear. The block generates the type 2 and 2x frequency version of the type 2 internal source clocks. In standard operation (i.e., NOT power-save mode), the type 2 clock is generated by a feedback of the cpu_clk_z source clock output through a two-input mux driving (pre_cpu_clk) back into the D-input of the cpu_clk_z-generating flip flop which is sampled by a clock referenced to the external oscillator clock called osc_qualified (i.e., this is a divide-by-2 function); and in standard mode the 2x type 2 clock is essentially a buffered-and-muxed version of osc_qualified. When in power-save mode both the 1x and 2x Type 2 clocks are created starting through the Synchronous counter to two separate divide-by-2 final clock generators. For example, in divide-by-4 clock division the 2x clock will originate from Y0 of the counter (i.e., a /2 of osc_qualified) through the final divide-by-2 clock generator resulting in a divided-by-4 2x clock. Similarly, the 1x clock will originate from Y1 of the counter. Y1 of the counter is a divide-by-4 of osc_qualified, which is equal to a divide-by-2 of the "standard" cpu_clk. The standard cpu_clk is the 1x clock reference frequency. In other words, Y1 of the counter goes through the final divide-by-2 clock generator resulting in a divided-by-4 1x clock. In divide-by-8 mode, counter ports Y1 and Y2 are used respectively, and so on up to divide-by-64. When transitioning to, from, or within the power-save modes the transitions are designed to be glitch free. All changes in frequency are made after the first osc_qualified rising edge sample of an active load_1 input pulse which is generated by the PSVMCD immediately after a falling edge on cpu_clk. The new values of the svb_d1_5_sync and psvm_d1_5_sync inputs on the same rising edge of osc_qualified. This process is done so that the total number of periods of the 2x clock is always double the 1x clock over any amount of changes in clock division. This is a critical feature necessary for correct operation of the system. Note that the changes in clock division occur when both the 1x and 2x type 2 clocks are low. Also, note that a 1 is synchronously loaded in the Synchronous counter during a change in frequency. This keeps the 1x and 2x type clocks phase relationship the same through changes in clock division which is also critical to correct system operation. (Power Save Mode).

Referring to FIG. 11, the Power-Save Mode Change Detection (PSVMCD) block 76 is used to sample changes in the Power Save Mode control configuration registers, SVB [2:0] and PSVM. Two banks of flipflops sampled off of opposite edges of an internal source clock of type 2 are compared (i.e. clocks cpu_clk and cpu_clk_z). When there is a difference between the two, an intermediate indicator is asserted called equality_z. If power-save mode is asserted in either or both of the sampling banks, i.e. psvm_d1_5 or psvm_d1, then a psvm_change indicator is asserted. This indication is then sampled by cpu_clk_z which is referenced to the fang edge of the system clock and generaes a synchronous pulse, referred to as load_1, until the next rising edge of an internally qualified reference to the external oscillator clock, i.e. osc_qualified, which is at least 2x the frequency of the system clock. So in summary, the load_1 pulse is generated by the PSVMCD 76 after the falling edge of the system clock and the load_1 pulse is again deasserted prior to the rising edge of the next system clock. The PSVMCD 76 is used to create and drive the load_1 pulse into the ISCG at a specific time point in the period of the current system clock and provide synchronized power save mode control signals, iLe. svb_d1_5_sync and psvm_d1_5_sync that change and become valid with the falling edge (deassertion edge) of the load_1 pulse which as described in the ISCG is after the fist rising edge of osc_qualified immediately after a falling edge on cpu_clk. (TIe one exception to this is where the SVB[2:0] bus is changing and the PSVM is deasserted. In this case a load_1 pulse will not be created.) This process guarantees that there will be no clock glitches generated in the ISCG when changing the level of clock division.

The invention embodiments described herein have been implemented in an integrated circuit which includes a number of additional functions and features which are described in the following co-pending, commonly assigned patent applications, the disclosure of each of which is incorporated herein by U.S. patent application Ser. No. 08/451,219, entitled "DISPLAY CONTROLLER CAPABLE OF ACCESSING AN EXTERNAL MEMORY FOR GRAY SCALE MODULATION DATA"; U.S. Pat. No. 5,696,994, entitled "SERIAL INTERFACE HAVING CONTROL CIRCUITS FOR ENABLING OR DISABLING N-CHANNEL OR P-CHANNEL TRANSISTORS TO ALLOW FOR OPERATION IN TWO DIFFERENT TRANSFER MODES"; U.S. Pat. application Ser. No. 08/453,076, entitled "HIGH PERFORMANCE MULTIFUNCTION DIRECT MEMORY ACCESS (DMA) CONTROLLER"; U.S. patent application Ser. No. 08/452,001, entitled "OPEN DRAIN MULTI-SOURCE CLOCK GENERATOR HAVING MINIMUM PULSE WIDTH"; U.S. patent application Ser. No. 08/451,503, entitled "INTEGRATED CIRCUIT WITH MULTIPLE FUNCTIONS SHARING MULTIPLE INTERNAL SIGNAL BUSES ACCORDING TO DISTRIBUTED BUS ACCESS AND CONTROL ARBITRATION"; U.S. Pat. No. 5,655,139, entitled "EXECUTION UNIT ARCHITECTURE TO SUPPORT THE x86 INSTRUCTION SET AND x86 SEGMENTED ADDRESSING"; U.S. Pat. No. 5,652,718, entitled "BARREL SHIFTER"; U.S. patent application Ser. No. 08/451,204, entitled "BIT SEARCHING THROUGH 8, 16, OR 32-BIT OPERANDS USING A 32-BIT DATA PATH"; U.S. Pat. No. 5,687,102, entitled "DOUBLE PRECISION (64-BIT) SHIFT OPERATIONS USING A 32-BIT DATA PATH"; U.S. patent application Ser. No. 08/451,571, entitled "METHOD FOR PERFORMING SIGNED DIVISION"; U.S. Pat. No. 5,682,339, entitled "METHOD FOR PERFORMING ROTATE THROUGH CARRY USING A 32-BIT BARREL SHIFTER AND COUNTER"; U.S. patent application Ser. No. 08/451,434, entitled "AREA AND TIME EFFICIENT FIELD EXTRACTION CIRCUIT"; U.S. Pat. No. 5,617,543, entitled "NON-ARITHMETICAL CIRCULAR BUFFER CELL AVAILABILITY STATUS INDICATOR CIRCUIT"; U.S. patent application Ser. No. 08/445,563, entitled "TAGGED PREFETCH AND INSTRUCTION DECODER FOR VARIABLE LENGTH INSTRUCTION SET AND METHOD OF OPERATION"; U.S. Pat. No. 5,546,353, entitled "PARTITIONED DECODER CIRCUIT FOR LOW POWER OPERATION"; U.S. Pat. No. 5,649,147, entitled "CIRCUIT FOR DESIGNATING INSTRUCTION POINTERS FOR USE BY A PROCESSOR DECODER"; U.S. Pat. No. 5,598,112, entitled "CIRCUIT FOR GENERATING A DEMAND-BASED GATED CLOCK"; U.S. Pat. No. 5,583,453, entitled "INCREMENTOR/DECREMENTOR"; U.S. Pat. application Ser. No. 08/451,150, entitled "A PIPELINED MICROPROCESSOR THAT PIPELINES MEMORY REQUESTS TO AN EXTERNAL MEMORY"; U.S. patent application Ser. No. 08/451,198, entitled "CODE BREAKPOINT DECODER"; U.S. Pat. No. 5,680,564, entitled "PIPELINED PROCESSOR WITH TWO TIER PREFETCH BUFFER STRUCTURE AND METHOD WITH BYPASS"; U.S. patent application Ser. No. 08/445,564, entitled "INSTRUCTION LIMIT CHECK FOR MICROPROCESSOR"; U.S. patent application Ser. No. 08/452,306, entitled "A PIPELINED MICROPROCESSOR THAT MAKES MEMORY REQUESTS TO A CACHE MEMORY AND AN EXTERNAL MEMORY CONTROLLER DURING THE SAME CLOCK CYCLE"; U.S. patent application Ser. No. 08/452,080, entitled "APPARATUS AND METHOD FOR EFFICIENT COMPUTATION OF A 486™ MICROPROCESSOR COMPATIBLE POP INSTRUCTION"; U.S. patent application Ser. No. 08/450,154, entitled "APPARATUS AND METHOD FOR EFFICIENTLY DETERMINING ADDRESSES FOR MISALIGNED DATA STORED IN MEMORY"; U.S. Pat. No. 5,692,146, entitled "METHOD OF IMPLEMENTING FAST 486™ MICROPROCESSOR COMPATIBLE STRING OPERATIONS"; U.S. Pat. No. 5,659,712, entitled "PIPELINED MICROPROCESSOR THAT PREVENTS THE CACHE FROM BEING READ WHEN THE CONTENTS OF THE CACHE ARE INVALID"; U.S. patent application Ser. No. 08/451,507, entitled "DRAM CONTROLLER THAT REDUCES THE TIME REQUIRED TO PROCESS MEMORY REQUESTS"; U.S. patent application Ser. No. 08/451,420, entitled "INTEGRATED PRIMARY BUS AND SECONDARY BUS CONTROLLER WITH REDUCED PIN COUNT"; U.S. Pat. No. 5,612,637, entitled "SUPPLY AND INTERFACE CONFIGURABLE INPUT/OUTPUT BUFFER"; U.S. patent application Ser. No. 08/451,744, entitled "CLOCK GENERATION CIRCUIT FOR A DISPLAY CONTROLLER HAVING A FINE TUNEABLE FRAME RATE"; U.S. patent application Ser. No. 08/451,206, entitled "CONFIGURABLE POWER MANAGEMENT SCHEME"; U.S. patent application Ser. No. 08/452,350, entitled "BIDIRECTIONAL PARALLEL SIGNAL INTERFACE"; U.S. patent application Ser. No. 08/452,094, entitled "LIQUID CRYSTAL DISPLAY (LCD) PROTECTION CIRCUIT"; U.S. patent application Ser. No. 08/450,156, entitled "DISPLAY CONTROLLER CAPABLE OF ACCESSING GRAPHICS DATA FROM A SHARED SYSTEM MEMORY"; U.S. Pat. No. 5,541,935, entitled "INTEGRATED CIRCUIT WITH TEST SIGNAL BUSES AND TEST CONTROL CIRCUITS"; U.S. Pat. No. 5,699,506, entitled "METHOD AND APPARATUS FOR FAULT TESTING A PIPELINED PROCESSOR".

It should be understood that varius alternatives to the embodiments of the invention described herein may be employed in practicing the invention. It is intended that the following claims define the scope of the invention and that structures and metods within the scope of these claims and their equvalents be covered thereby.

What is claimed is:

1. An apparatus including a power management system clock enable circuit, the sower management system clock enable circuit comprising:

a clock branch generator configured to receive a first source clock sicmal and to generate a CPU clock signal in response thereto to drive a CPU which is internal to the; and clock enabling/disabling circuitry configured to disable the CPU clock signal after a first falling edge of the first source clock signal, hold the CPU clock signal low during disabling, and re-enable the CPU clock signal after a second falling edge of the first source clock signal so that the CPU clock signal goes high on a rising transition of the first source clock signal immediately following the second falling edge of the first source clock signal, the clock enabling/disabling circuitry configured to not disable the CPU clock signal when the CPU is actively performing a bus cycle.

2. An apparatus according to claim 1, wherein the clock enabling/disabling circuitry is further configured to disable the CPU clock signal only in response to receipt of an idle acknowledge signal.

3. An apparatus according to claim 1, wherein the clock branch generator is further configured to generate a first peripheral clock signal in response to the first source clock signal to drive a first sequential device which is internal to the apparatus.

4. An apparatus according to claim 1, wherein the clock branch generator is further configured to receive a second source clock signal and to generate a first peripheral clock signal in response thereto to drive a first sequential device which is internal to the apparatus.

5. An apparatus according to claim 1, wherein the apparatus further comprises:

a power management system source clock generation circuit, coupled to the power management system clock enable circuit, configured to generate the first source clock signal.

6. An apparatus according to claim 5, wherein the power management system source clock generation circuit comprises:

a synchronous counter with a synchronous load to a count of one and an asynchronous clear, the synchronous counter having a plurality of count output signals;

a first multiplexer coupled to the synchronous counter for receiving the plurality of count output signals, the first multiplexer having two outputs;

a second multiplexer coupled to the first multiplexer, the second multiplexer having one output;

a flip-flop coupled to the output of the second multiplexer; and a clock referenced to an external oscillator clock for sampling an output of the flip-flop.

7. An apparatus according to claim 5, wherein the apparatus further comprises:

a power management system power-save mode change detection circuit, coupled to the power management system source clock generation circuit, configured to prevent the power management system source clock generation circuit from generating clock glitches when changing a level of clock division.

8. An apparatus according to claim 7, wherein the power management system power-save mode change detection circuit comprises:

an internal source clock;

a first bank of flip-flops coupled to the internal source clock;

a second bank of flip-flops coupled to the internal source clock;

a comparator for comparing the first and second banks of flip-flops, the comparator generating an equality signal when there is a difference between storage values of the first and second banks of flip-flops;

means for asserting a change indicator when a power-save mode is asserted in one of the first and second banks of flip-flops; and means for sampling the change indicator with a clock which is referenced to a falling edge of a system clock and for generating a synchronous load one pulse until a next rising edge of an internally qualified reference an external oscillator clock.

9. An apparatus including a power management system clock enable circuit, the power management system clock enable circuit comprising:

a first input node configured to receive a first source clock signal;

a first output AND gate having a first input coupled to receive a first delayed version of the first source clock signal and an output on which a CPU clock signal is generated;

a first flip-flop having a clock input coupled to receive a second delayed version of the first source clock signal and a data output which is delayed and then coupled to a second input of the first output AND gate; and a second flip-flop having a clock input coupled to receive the second delayed version of the first source clock signal, a data output coupled to a data input of the first flip-flop, and a data input coupled to an idle acknowledge input node;

wherein the CPU clock signal is disabled after a first falling edge of the first source clock signal, is held low during disabling, and is re-enabled after a second falling edge of the first source clock signal so that the CPU clock signal goes high on a rising transition of the first source clock signal immediately following the second falling edge of the first source clock signal.

10. An apparatus according to claim 9, wherein the CPU clock signal is not disabled when a CPU which is coupled to the CPU clock signal is actively performing a bus cycle.

11. An apparatus according to claim 9, wherein the CPU clock signal is disabled only in response to receipt of an idle acknowledge signal received at the idle acknowledge input node.

12. An apparatus according to claim 9, wherein the power management system clock enable circuit further comprises:

a second output AND gate having a first input coupled to receive the first delayed version of the first source clock signal and an output on which a first peripheral clock signal is generated; and a third flip-flop having a clock input coupled to receive the second delayed version of the first source clock signal and a data output which is delayed and then coupled to a second input of the second output AND gate.

13. An apparatus according to claim 9, wherein the power management system clock enable circuit further comprises:

a second input node configured to receive a second source clock signal;

a second output AND gate having a first input coupled to receive a modified version of the second source clock signal and an output on which a first peripheral clock signal is generated; and a third flip-flop having a clock input coupled to receive the modified version of the second source clock signal and a data output which is coupled to a second input of the second output AND gate.

14. An apparatus according to claim 9, wherein the apparatus further comprises:

a power management system source clock generation circuit, coupled to the power management system clock enable circuit, configured to generate the first source clock signal.

15. An apparatus according to claim 14, wherein the power management system source clock generation circuit comprises:

a synchronous counter with a synchronous load to a count of one and an asynchronous clear, the synchronous counter having a plurality of count output signals;

a first multiplexer coupled to the synchronous counter for receiving the plurality of count output signals, the first multiplexer having two outputs;

a second multiplexer coupled to the first multiplexer, the second multiplexer having one output;

a flip-flop coupled to the output of the second multiplexer; and a clock referenced to an external oscillator clock for sampling an output of the flip-flop.

16. An apparatus according to claim 14, wherein the apparatus further comprises:

a power management system power-save mode change detection circuit, coupled to the power management system source clock generation circuit, configured to prevent the power management system source clock generation circuit from generating clock glitches when changing a level of clock division.

17. An apparatus according to claim 16, wherein the power management system power-save mode change detection circuit comprises:

an internal source clock;

a first bank of flip-flops coupled to the internal source clock;

a second bank of flip-flops coupled to the internal source clock;

a comparator for comparing the first and second banks of flip-flops, the comparator generating an equality signal when there is a difference between storage values of the first and second banks of flip-flops;

means for asserting a change indicator when a power-save mode is asserted in one of the first and second banks of flip-flops; and means for sampling the change indicator with a clock which is referenced to a falling edge of a system clock and for generating a synchronous load one pulse until a next rising edge of an internally qualified reference an external oscillator clock.

18. A method of generating clock signals in a power management system, comprising the steps of:

receiving a first source clock signal;

generating a CPU clock signal in response to the first source clock signal to drive a CPU;

disabling the CPU clock signal after a first falling edge of the first source clock signal;

holding the CPU clock signal low during disabling;

re-enabling the CPU clock signal after a second falling edge of the first source clock signal so that the CPU clock signal goes high on a rising transition of the first source clock signal immediately following the second falling edge of the first source clock signal; and maintaining the CPU clock signal in an enabled state when the CPU is actively performing a bus cycle.

19. A method according to claim 18, further comprising the steps of:

disabling the CPU clock signal only in response to receipt of an idle acknowledge signal.

20. A method according to claim 18, further comprising the steps of:

generating a first peripheral clock signal in response to the first source clock signal to drive a first sequential device.

21. A method according to claim 18, further comprising the steps of:

receiving a second source clock signal; and generating a first peripheral clock signal in response to the second source clock signal to drive a first sequential device.

* * * * *

UNITED STATES PATENT AND TRADEMARK OFFICE
CERTIFICATE OF CORRECTION

PATENT NO.: 6,021,501
DATED: February 1, 2000
INVENTOR(S): Michael John Shay

It is certified that errors appear in the above-identified patent and that said Letters Patent is hereby corrected as shown below:

In Col. 12, line 40, delete "sower" and replace with --power--.

In Col. 12, line 43, after "source clock" delete "sicmal" and replace with --signal--.

In Col. 12, line 45, after "the" insert --apparatus--.

Signed and Sealed this

Twenty-fourth Day of October, 2000

Attest:

Q. TODD DICKINSON

*Attesting Officer*  *Director of Patents and Trademarks*